United States Patent
Kanno

(10) Patent No.: US 6,580,059 B1
(45) Date of Patent: Jun. 17, 2003

(54) CONTROL APPARATUS FOR A LIGHT RADIATION-TYPE RAPID HEATING AND PROCESSING DEVICE

(75) Inventor: Takayuki Kanno, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/684,981

(22) Filed: Oct. 10, 2000

(30) Foreign Application Priority Data

Oct. 7, 1999 (JP) .......................................... 11-286637

(51) Int. Cl.$^7$ ................................................ H05B 1/02
(52) U.S. Cl. ...................... 219/486; 219/483; 219/501; 219/508; 219/497; 392/416
(58) Field of Search ................................ 219/481, 494, 219/497, 501, 499, 216, 505, 508, 486; 392/416; 118/724, 725; 432/24

(56) References Cited

U.S. PATENT DOCUMENTS

| 4,723,068 A | * | 2/1988 | Kusuda ....................... 219/486 |
| 4,859,832 A | | 8/1989 | Uehara et al. .............. 219/411 |
| 5,811,764 A | * | 9/1998 | Hirst ........................... 219/497 |
| 6,044,203 A | * | 3/2000 | Dawson et al. ............ 392/416 |
| 6,072,163 A | * | 6/2000 | Armstrong et al. ......... 219/497 |
| 6,164,963 A | * | 12/2000 | Weaver ....................... 432/241 |

FOREIGN PATENT DOCUMENTS

JP 08-162257 6/1996

OTHER PUBLICATIONS

Examiner: F. Castanheira Nunes, European Search Report, Place of Search: The Hague, 3 Pages, Date of Search: Mar. 27, 2001.

* cited by examiner

Primary Examiner—Mark Paschall
(74) Attorney, Agent, or Firm—Nixon Peabody LLP; David S. Safran

(57) ABSTRACT

There is provided a control apparatus for a light radiation-type rapid heating and processing device in which a power factor can be improved, the influence of a higher harmonics strain can be eliminated and a rapid temperature increase of a heated substrate can be performed without any delay in control. Lamps are arranged within a lamp chamber of the light radiation-type rapid heating and processing device, and the workpiece heated and processed is arranged in a processing chamber. The region where the lamps are arranged is divided into a plurality of zones corresponding to a distance from the center of the region, and at least one lamp is arranged in each of the zones. A power control unit is provided for each of the zones. The control parts generate a PWM signal in response to a control pattern stored in advance and send it to each of the power control units. The power control units are provided with a switching element which is turned ON/OFF by the PWM signal and control the power supplied to the lamp belonging to each of the zones.

8 Claims, 15 Drawing Sheets

Fig.9B PWM VARIATION AT POINT A

Fig.9C PWM VARIATION AT POINT B

Fig.9D PWM VARIATION AT POINT C

Fig.9E PWM VARIATION AT POINT D

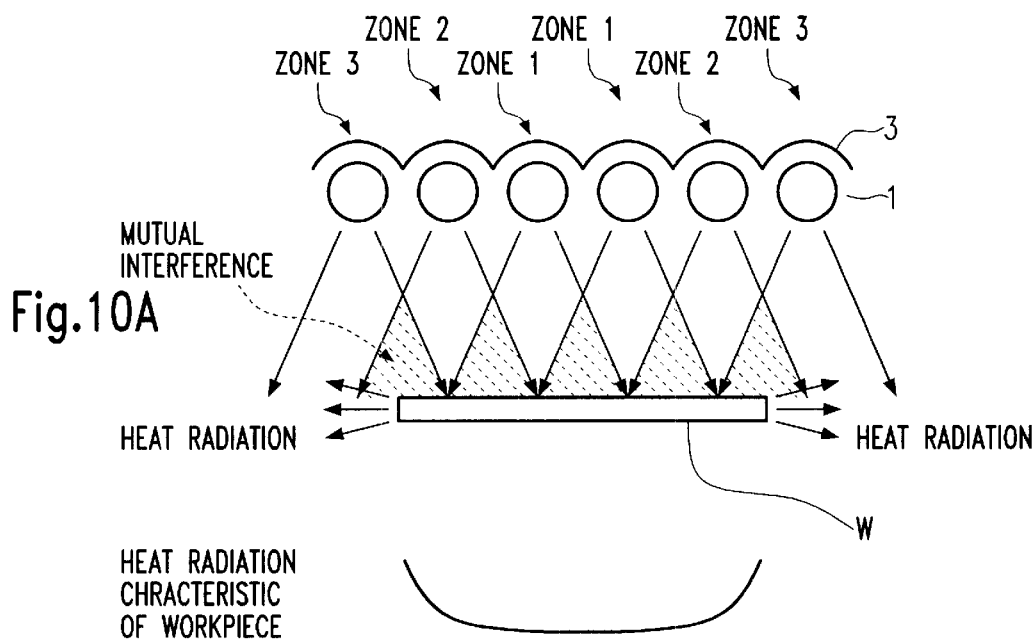

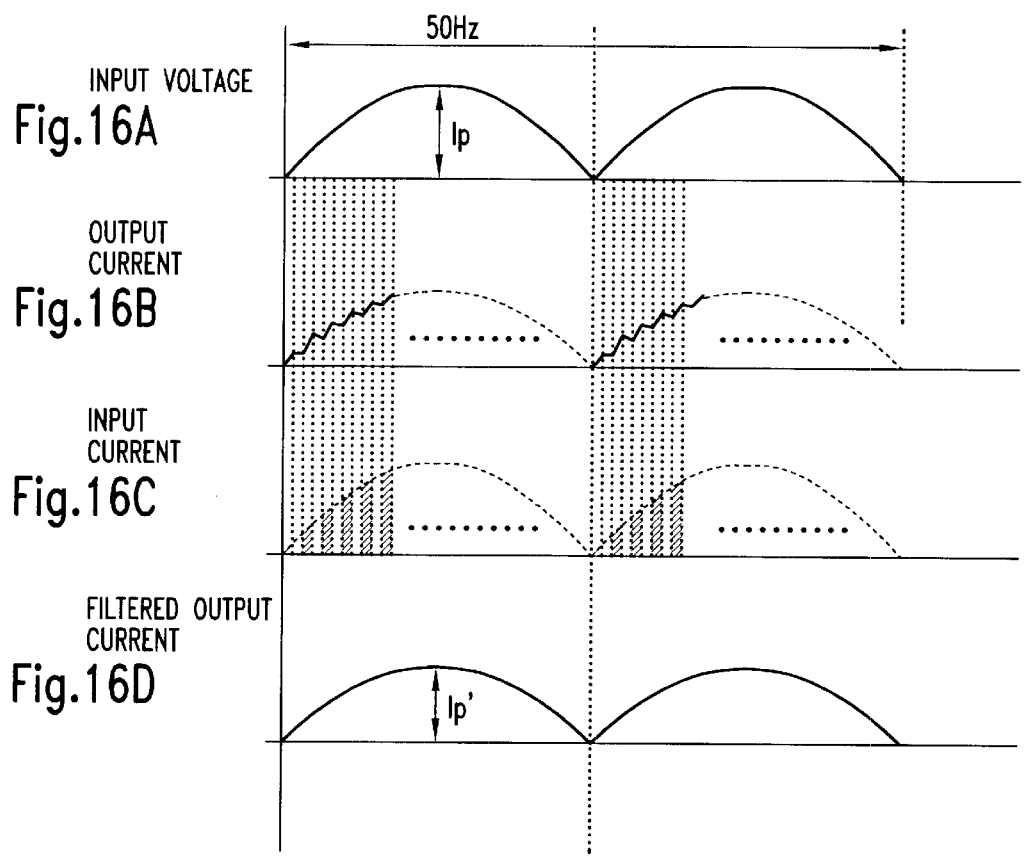
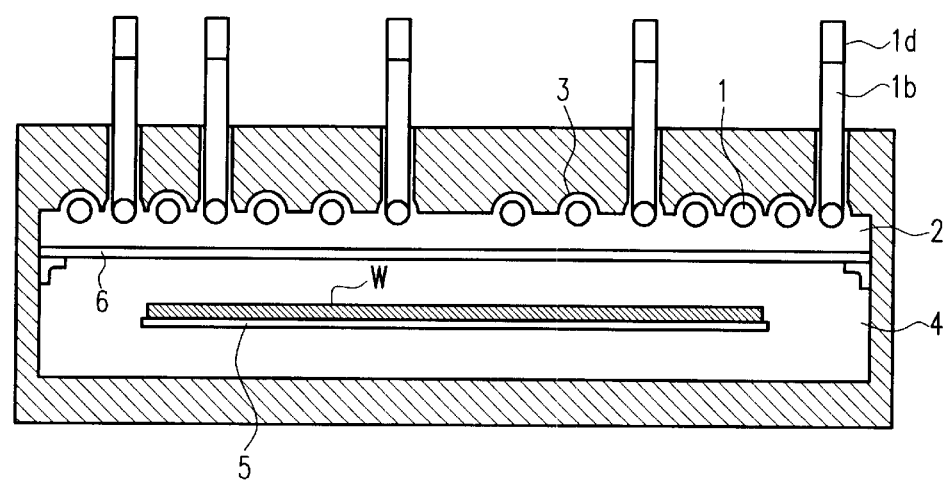

INPUT VOLTAGE

GATE CURRENT

OUTPUT CURRENT
(OUTPUT VOLTAGE)

INPUT VOLTAGE

GATE CURRENT

OUTPUT CURRENT
(OUTPUT VOLTAGE)

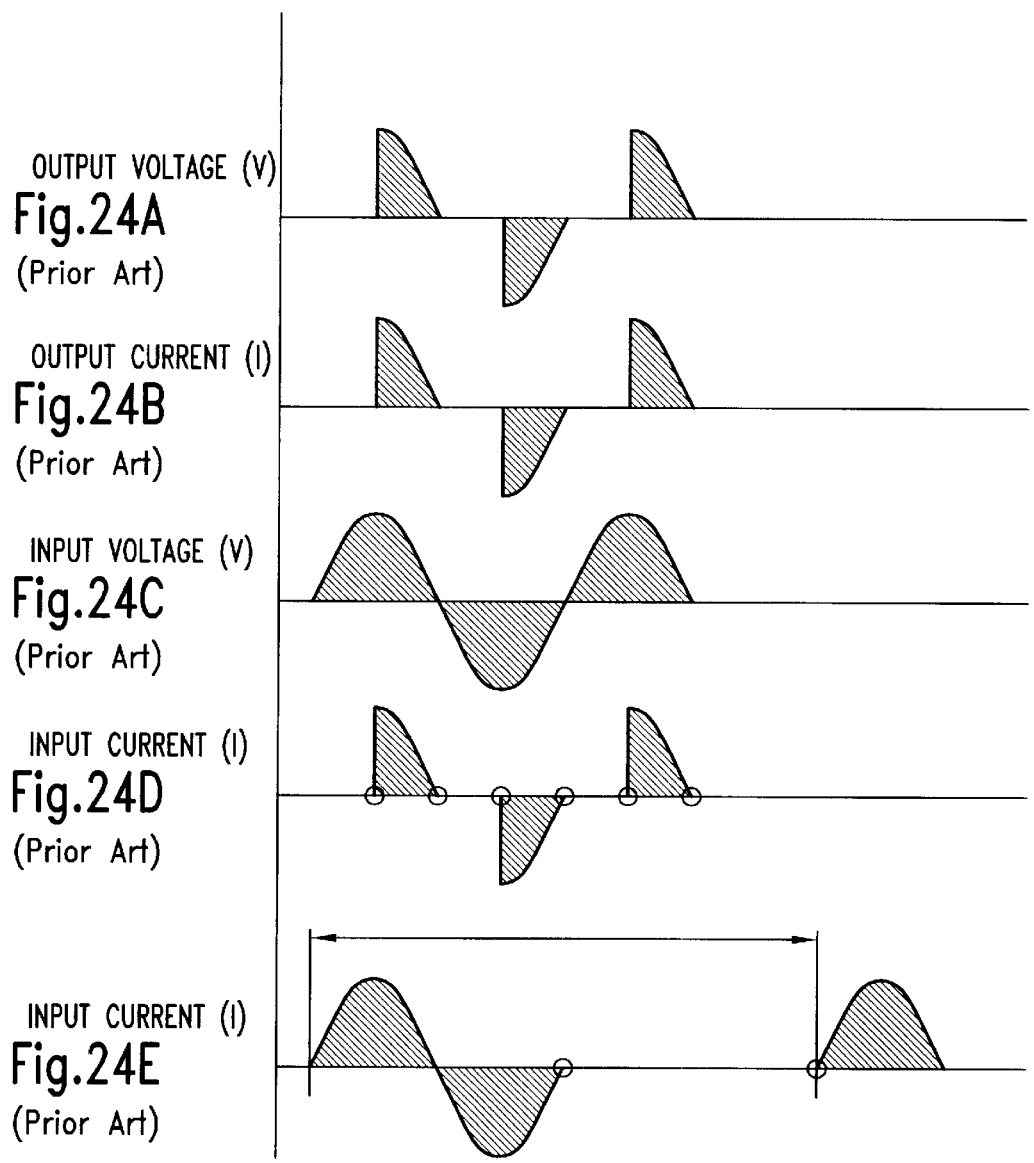

CONTROL APPARATUS FOR A LIGHT RADIATION-TYPE RAPID HEATING AND PROCESSING DEVICE

BACKGROUND OF THE INVENTION

1. Field of the Invention

This invention relates to a control apparatus for a light radiation-type rapid heating and processing device for rapidly heating a processed workpiece such as a semiconductor wafer by radiating light including infrared rays to perform processing such as a film formation, dispersion and annealing or the like.

2. Description of the Related Art

In recent years, a high integration and a fine formation of a semiconductor integrated circuit have been required more and more, and a stage for implanting impurities into the Si crystal of a semiconductor wafer through an ion implantation process, for example, has required the formation of a thin dispersed layer of the impurities and the necessity of forming a more shallow junction plane has increased.

In the case of dispersing impurities through an ion implantation process, an implantation stage for accelerating the ionized impurities through an electric field and implanting them into the Si crystal as well as an annealing stage for dispersing the impurities in the crystal while recovering damages applied to the crystal through the implantation process are carried out. A rapid thermal processing (RTP) is necessary for forming a shallow dispersion layer. It is further necessary to rapidly increase the temperature while the surface temperature of the semiconductor wafer is being kept uniform. If the film thickness of the dispersion layer has to be about 0.13 to 0.15 $\mu m$, it becomes necessary to attain a temperature increasing speed of about 150 to 200° C./sec.

A light radiation-type rapid heating and processing device for radiating light including infrared rays which radiates light from filament lamps for heating a workpiece such as a semiconductor wafer and the like is preferable for the aforesaid rapid thermal processing (RTP), and it is possible to increase the temperature of the heated substrate up to a temperature of 1000° C. or more within several seconds.

FIG. 17 is a view showing a sectional configuration of a light radiation-type rapid heating and processing device (hereinafter abbreviated as a heating and processing device).

A plurality of filament lamps 1 (hereinafter abbreviated as lamps) are arranged in a lamp chamber 2, and a mirror 3 is arranged at the rear surfaces of the lamps 1. A workpiece carrier 5 is installed within a processing chamber 4, and a workpiece to be heated and processed, such as a semiconductor wafer or the like, (hereinafter called a workpiece W) is mounted on the workpiece carrier 5. In addition, the lamp chamber 2 and the processing chamber 4 may be separated by a window 6 such as a crystal window or the like.

FIG. 18 shows a possible configuration of the lamp 1. The lamp 1 is comprised of a circular light emitting tube 1a and a pair of feeding tubes 1b extending in a substantially right angle from end parts of the light emitting tube 1a. A coil-like filament 1c is arranged within the light emitting tube 1a. An end part of the feeding tube 1b is provided with a seal part 1d, and a lead wire 1e is connected to an end portion of the filament 1c through a molybdenum foil 1f as shown in FIG. 18.

In FIG. 17, circular lamps 1 as shown in FIG. 18 are arranged in a concentric manner, for example, and the aforesaid plurality of lamps 1 are lit to cause light including infrared rays radiated from the lamps 1 to be emitted through the crystal window 6 onto the workpiece W installed in the processing chamber. With such an arrangement as above, the workpiece W is rapidly heated and in turn the lamps 1 are turned off to cause the workpiece W to be rapidly cooled.

A control apparatus (not shown) may control the amount of electrical power supplied to each of the lamps 1 in such a manner that the entire workpiece W is uniformly heated, and, for example, the workpiece W is heated to a temperature of 1000° C. or more within several seconds.

FIGS. 19 and 20 show an example of the prior art configuration of the control apparatus for controlling the aforesaid lamps. FIG. 19 shows an entire configuration, and FIG. 20 shows a more detailed configuration of the controlling apparatus for controlling each of the lamps.

In FIGS. 19 and 20, reference number 100 denotes a control section constituted by a CPU and the like; 101 is a temperature adjusting device (hereinafter called a temperature adjuster); 102 a thyristor unit; 1 is a lamp and 103 a temperature sensor. As shown in these figures, each of the temperature adjusters 101, thyristor units 102 and temperature sensors 103 is arranged in correspondence with a lamp 1 (or in correspondence with an assembly of lamps). The temperature sensor 103 detects the temperature of the workpiece W to be heated through the light radiated from each of the lamps 1. The temperature detected by the temperature sensor 103 is fed back to the temperature adjuster 101 which feeds the temperature set value (either an analog signal or a digital signal) sent from the control section 100 and the control signal (an analog signal) corresponding to a deviation of the temperature detected by the temperature sensor 103 to the thyristor unit 102.

Each of voltage and current supplied to the lamp 1 is fed back to the thyristor unit 102. The thyristor unit 102 controls the electrical power supplied to the lamp 1 dependent on the aforesaid control signal.

The thyristor unit 102 may have the configuration shown in FIG. 21 where the electrical power supplied to the lamp 1 is controlled by changing the timing during which a gate current flows from SCR2.

As regards the electrical power control by the thyristor, it is possible to apply the following two methods, namely a conductive angle control and a zero-cross control.

(a) Conductive Angle Control

In FIG. 21, an alternating current is supplied to the thyristor unit 102 from an AC commercial power supply 21. The thyristor unit 102 is provided with a lamp control circuit 200 comprised of a first thyristor SCR1 and a second thyristor SCR2. When a gate current flows in gates G1, G2 of the thyristors SCR1 and SCR2 of the lamp control circuit 200, the thyristors SCR1 and SCR2 become conductive and a current is outputted from the thyristor unit 102 to the lamp 1 until the current supplied to the thyristors SCR1 and SCR2 becomes 0.

FIG. 22(a) shows an input voltage waveform of the thyristor unit 102. FIG. 22(b) shows an example of the timing of a gate current supplied to gates G1, G2 of the thyristors SCR1, SCR2, wherein 1 indicates a gate current of the first thyristor SCR1, and 2 indicates a gate current of the second thyristor SCR2, respectively. FIG. 22(c) indicates a waveform of an output current when a gate current is provided with the timing illustrated in FIG. 22(a).

The output current from the thyristor unit 102 is a current with an output voltage waveform and an output current waveform as indicated by the hatched sections in FIG. 22(c) being multiplied with each other. When the timing of the gate current applied to each of the thyristors SCR1, SCR2 is changed the output current waveform and the output voltage waveform are changed resulting in that the output power of the thyristor unit, i.e., the lamp input power, are changed.

(b) Zero Cross Control

The control circuit configuration is the same as that shown in FIG. 21. The timing of the gate current of each of SCR1 and SCR2 corresponds to that shown in FIG. 23(b). In this case, 1 indicates the gate current of the first thyristor SCR1 and 2 indicates the gate current of the second thyristor SCR2.

In FIG. 23, the output current and the output voltage when the gate current is supplied with the timing shown in FIG. 23(b) correspond to that shown in FIG. 23(c). That is, as indicated in FIG. 23(c), it is possible to change the lamp input power by outputting a current and voltage with their waveforms being deleted.

However, the aforesaid prior art control system has the following problems.

(1) Problem of Delay in Control

In order to perform a rapid thermal processing (RTP) with the light radiation-type rapid heating and processing device, it is necessary to increase the temperature of the semiconductor wafer more than 1000° C. within several seconds while keeping the surface temperature of the semiconductor wafer uniform as described above. In particular, since the thermal radiation characteristic at a peripheral part of the semiconductor wafer is different from that at its central part, it is necessary to increase the temperature rapidly while the amount of heat supplied to the peripheral part is slightly higher than that of the central part so that the temperature of the semiconductor wafer becomes uniform.

Due to this fact, the control apparatus for controlling the lamp power must perform a high speed control over the electrical power supplied to the lamp while the distribution of each of the lamp powers is being properly held.

In the case of using the control systems illustrated in FIGS. 19 and 20, performing such a control as described above exhibited the following problems.

1.) Since the temperature detected by the temperature sensor 103 is fed back to the temperature adjuster 101 for control, a delay may occur due to a delay in sensing caused by the temperature sensor 103, and a high speed control is hard to perform.

2.) Since the response of the thyristor 102 is slow, it is not possible to perform a high speed control over the lamp electrical power. In addition, in the case of performing the aforesaid conductive angle control, it may happen that a noise called a raising noise is generated in the thyristor conduction state. This may lead to performing an erroneous operation of the control system for the device. In addition, since a rush current flows in the lamp filament, the filament may be excessively loaded and may easily be cut.

3.) Although either a digital or analogue control signal can be sent from the controller 100 to the temperature adjuster 101, in the case that a digital signal is sent out, it is necessary to convert it into an analogue signal in the temperature adjuster 101, resulting in a delay during conversion. In addition, in case of sending an analogue signal, it is necessary to convert the digital signal to an analogue signal at the control section 100 resulting in a delay during conversion.

(2) Occurrence of a Higher Harmonic Strain

This problem will be described with reference to the conductive angle control shown in FIG. 22 wherein, as described above, both the output voltage and the output current become as shown in (a) and (b) of FIG. 24 in case an electrical power control is performed at the output side.

In turn, the waveform of the input voltage at the thyristor unit 102 is a voltage waveform of the commercial AC power supply 21 as shown in FIG. 24(c). In addition, the waveform of the input current is the same as that of the output current as shown in FIG. 24(d).

When the input current has a waveform as described above the following problem may occur. The waveform part marked by a circle in FIG. 24(d) is non-linear, which means that a higher harmonic strain may be generated in the input current. Such a higher harmonic strain is undesirable.

A similar problem may also arise in the case of a zero cross control shown in FIG. 23 described above. The part indicated by a circle in FIG. 24(e) denotes a non-linear part where a higher harmonic strain may occur.

(3) Occurrence of Reactive Power

In FIG. 22, when V is the input voltage, I the input current, W is an effective power and a value of V×I is the apparent power, the following relation can be assumed when the waveform of the input voltage and the waveform of the input current are sinusoidal waves and have no phase differences:

$$V \times I = W$$

where W can be considered as an output power (a lamp input power).

However, if the strain waveform is applied as shown in FIG. 24(d) a reactive power (=V×I−W) is generated without fail. Accordingly, if one tries to output a certain reactive power W at the strained waveform as shown in (d) of FIG. 24, a higher apparent power of V×I as compared with one having a sinusoidal waveform is required.

Similarly, in the case of a zero cross control, the part indicated by an arrow in FIG. 24(e) can be considered as one period, so that a reactive power is generated.

With regard to the aforesaid reactive power, the reactive power is generated once the output power is controlled. This is a substantial problem in the case that an actual device is manufactured.

That is, due to the following reasons, the output power of the thyristor unit 102 is always controlled and the reactive power is generated without fail, so that a power-factor is decreased.

1.) Practically, in the case of the light radiating-type rapid heating and processing device, if a commercial 200 V is supplied to the lamp device, for example, usually a lamp with a rated 180 V, which is lower than the input voltage by about 10%, is used in consideration of a voltage variation of 10%, and a surplus range is applied to the device. Accordingly, even in the case that the lamp is lit using a rated voltage, the output of the lamp device is controlled.

2.) Further, an electrical power supplied to a plurality of lamps is controlled in the case of the light radiation-type heating and processing device although it is possible that their rated voltage is different (the lengths of filaments are different from each other) with respect to the lamps to be used. Also in this case, the output power is always controlled.

In particular, in the case that the light radiation-type rapid heating and processing device is used for the aforesaid rapid thermal processing (RTP), it is necessary that a temperature of the workpiece is rapidly increased up to about 1000° C. in several seconds, and the entire amount of electrical power supplied to the lamp 1 is quite high and ranges from about several tens kW to about 200 kW, and also the input current is quite high. Due to this fact, it is necessary to reduce the occurrence of a reactive power to a minimum in order to improve the efficiency, to reduce the input current and to save energy.

SUMMARY OF THE INVENTION

The present invention has been invented with regard to the aforesaid circumstances, and it is an object of the present invention to provide a control apparatus for a light radiation-type rapid heating and processing device in which the temperature of a workpiece can be rapidly increased while its surface temperature is being kept uniform, whose power factor is not reduced and a higher harmonic strain is avoided.

The aforesaid problems are overcome by the present invention as follows.

(1) In a control apparatus for a light radiation-type rapid heating and processing device having a plurality of filament lamps for emitting light including infrared rays onto a processed substrate to cause the processed substrate to be rapidly heated, the region where the plurality of filament lamps are arranged is divided into a plurality of zones corresponding to a distance from the center of the region and at least one filament lamp is installed in each of the zones. The aforesaid control apparatus is constituted by a plurality of lamp power control units having switching elements arranged in correspondence with the zones for switching either a sinusoidal alternating current (AC) supplied from an AC power supply or a full-wave rectified sinusoidal alternating current (AC), and a control section. The control section changes the duty factors of ON/OFF signals of each of the switching elements of said plurality of lamp power control units and controls the electrical power supplied to each filament lamp belonging to each of the zones.

(2) In the aforesaid item (1), a time-based changing pattern of the duty factors of the ON/OFF signals of the switching element belonging to each of the zones is calculated with reference to a thermal radiation characteristic of the processed substrate and a mutual interference between the filament lamps belonging to each of the zones, the time-based changing pattern is stored in advance in the control section, the control section reads out the time-based changing pattern and controls the electrical power supplied to each of the filament lamps belonging to each of the zones.

(3) In the above items (1) and (2), there is provided a phase sensing means for sensing the phase of an AC power supply, and the control section changes the duty factors of the ON/OFF signals of the switching elements in each of the zones at a zero cross point of the AC power supply detected by the phase sensing means.

(4) In the above items (1) and (2), there is provided a phase sensing means for sensing the phase of the AC power supply so as to switch the AC sinusoidal current supplied from the AC power supply synchronously with the phase signal of the AC power supply detected by the phase sensing means.

In case of the above item (1), the temperature of the processed substrate can be controlled without delay during control. In addition, the duty factors of the ON/OFF signals of each of the switching elements of the power control unit is changed and each of the electrical powers supplied to the filament lamps belonging to each of the zones is controlled so that the higher harmonics can be reduced and the power factor can be improved resulting in an improved efficiency of the device.

In the invention described in the above item (2), a high speed control can be carried out and the temperature of the processed substrate can be made uniform.

In the inventions described in the above items (3) and (4), it is possible to further reduce the higher harmonics, to improve the power factor and also to improve the efficiency.

As described above, the present invention may provide the following effects.

(1) The control device, in which the region having a plurality of filament lamps arranged therein is divided into a plurality of zones corresponding to a distance from the center of the region with at least one filament lamp being installed in each of the zones, and in which the electrical power supplied to the filament lamps is controlled, comprises a plurality of lamp power control units each of which is arranged in correspondence with a respective zone and has a switching element for switching either the sinusoidal alternating current supplied from the AC power supply or the full-wave rectified sinusoidal alternating current; and further comprises a control part for changing the duty factors of ON/OFF signals of each of the switching elements of each of the plurality of lamp power control units and for controlling the power supplied to each of the filament lamps belonging to each of the zones, resulting in that the temperature of the processed substrate can be controlled without any delay in control. In addition, it is possible to reduce the higher harmonics, improve the power factor and also improve efficiency.

(2) In view of the thermal radiation characteristic of the processed substrate and the mutual interference of the filament lamps belonging to each of the zones, a time-based changing pattern of the duty factors of the ON/OFF signal of the switching elements in each of the zones is calculated, the time-based changing pattern is read out by the control part, and the power supplied to each of the filament lamps belonging to each of the zones is controlled so that a high speed control can be carried out and, at the same time, the temperature of the processed substrate can be made uniform.

(3) There is provided a phase sensing means for sensing the phase of the AC power supply, wherein the control part changes the duty factors of the ON/OFF signal of the switching element in each of the zones at the zero cross point of the AC power supply detected by the phase sensing means, resulting in that the higher harmonics can be reduced further and the power factor can be improved.

(4) There is provided a phase sensing means for sensing the phase of the AC power supply, wherein the lamp power control unit performs a switching of the sinusoidal alternating current supplied from the AC power supply synchronously with the phase signal of the AC power supply detected by the phase sensing means so that the higher harmonics waveform can be reduced, the power factor can be improved and the input current can be reduced.

BRIEF DESCRIPTION OF THE DRAWINGS

FIG. 10 is a view illustrating a mutual interference of light radiated from the lamp, a thermal radiation characteristic of the workpiece and a power ratio of power supplied to the lamp.

FIG. 16 is a view showing a waveform of each of the sections in the lamp power control unit shown in FIG. 15.

FIG. 17 is a view showing a sectional configuration of a light radiation-type rapid heating and processing device.

FIG. 24 is a view showing an input current, an output current and a voltage waveform in the case that a conductive angle control and a zero-cross control are carried out.

DESCRIPTION OF THE PREFERRED EMBODIMENTS

Figure 1:
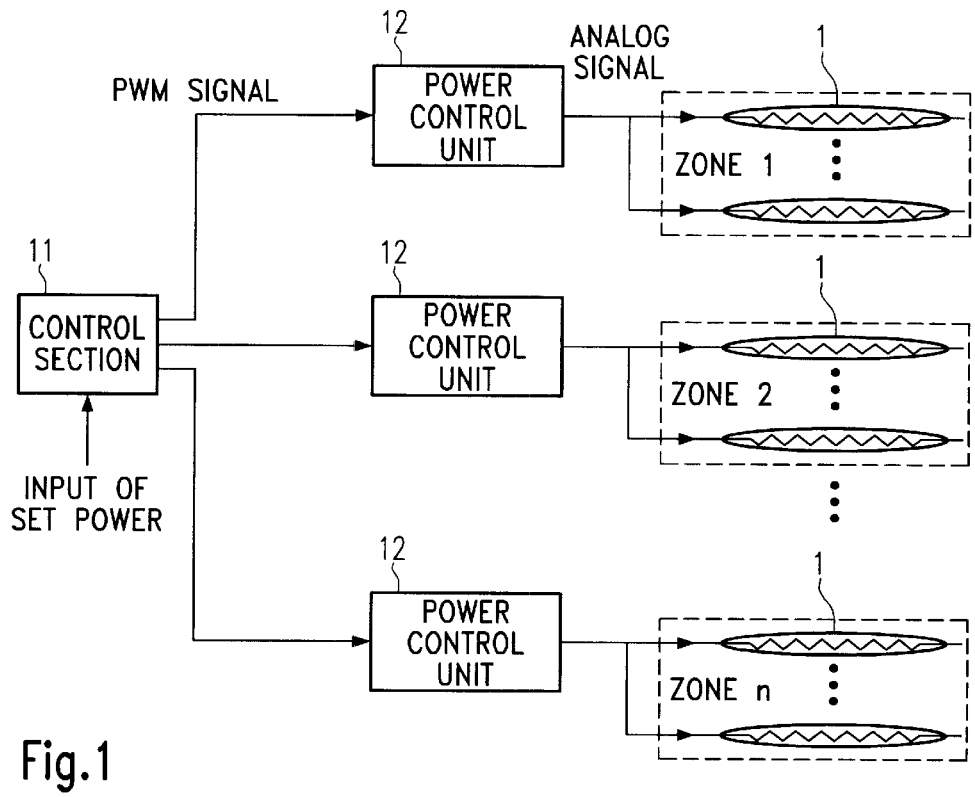
FIG. 1 is a view showing a schematic configuration of a preferred embodiment of the present invention.

FIG. 1 is a view showing a schematic configuration of a control apparatus for a light radiation-type rapid heating and processing device of a preferred embodiment of the present invention. In this figure, a control part 11 is constituted by a CPU or the like. A lamp power control unit 12 (hereinafter abbreviated as a power control unit) controls an electrical power supplied to the lamp 1. A PWM signal from the control part 11 is supplied to each of the power control units 12.

The power control unit 12 is provided with a switching element, changes a ratio (hereinafter called a duty factor) between ON time and OFF time of the switching element with the PWM signal outputted by the control part 11 and controls an electrical power supplied to the lamp 1.

As illustrated in FIG. 17, the lamp 1 is arranged within a lamp chamber 2, a workpiece carrier 5 is arranged within the processing chamber 4, and the workpiece W to be heated and processed is mounted on the workpiece carrier 5.

In addition, the region having the lamps 1 installed therein is divided into a plurality of zones corresponding to a distance from the center of the region. At least one lamp is mounted in each of the zones. One power control unit 12 is arranged in connection with each of the zones, and the power supplied to the lamps 1 belonging to each of the zones is controlled by the respective power control unit 12.

Figure 2:
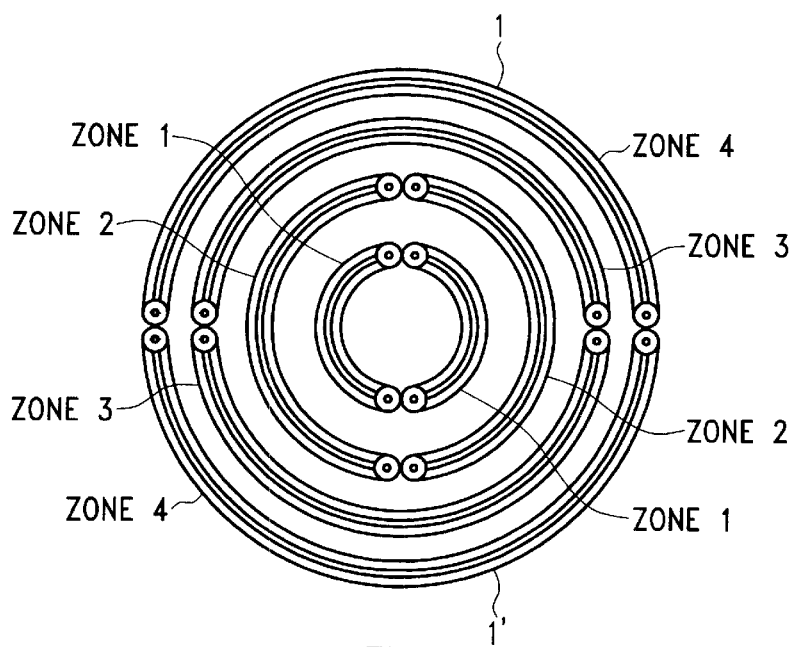
FIG. 2 is a view showing an example (1) of an arrangement of the lamps.
Figure 4:
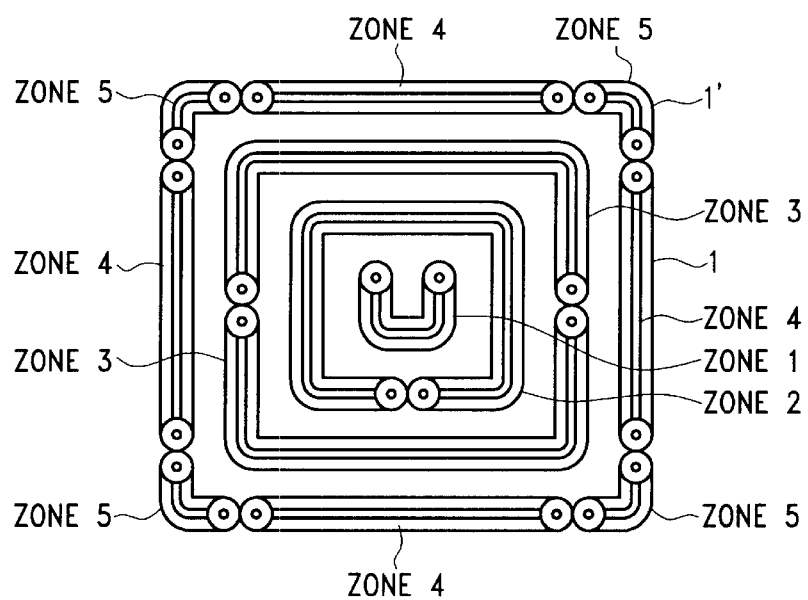
FIG. 4 is a view showing an example (2) of an arrangement of lamps.

FIGS. 2, 4 and 5 show an example of an arrangement of lamps.

Figure 3:
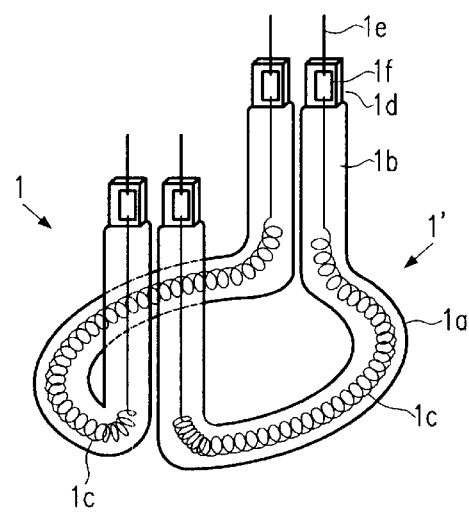
FIG. 3 is a view showing an example of a configuration of an annular lamp having two semi-circular lamps combined with each other.

FIG. 2 shows a case in which two semi-circular lamps 1, 1' are combined as shown in FIG. 3 to form an annular shape, and a plurality of lamp pairs are arranged concentrically.

As shown in FIG. 3, the two lamps 1, 1' are each comprised of a pair of feeding tubes 1b extending at a substantially right angle from the ends of the semi-circular light emitting tube 1a. A coil-shaped filament 1c is arranged within the light emitting tube 1a. The end part of the feeding tube 1b is provided with a seal part 1d, and a lead wire 1e is connected to the end part of the filament 1c through a molybdenum foil 1f.

Figure 18:
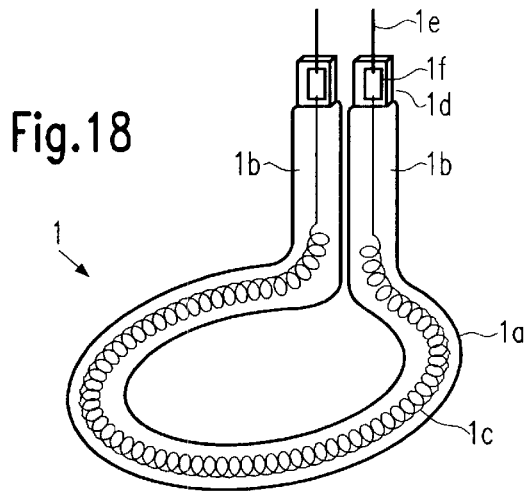
FIG. 18 is a view showing an example of configuration of an annular lamp.
Figure 19:
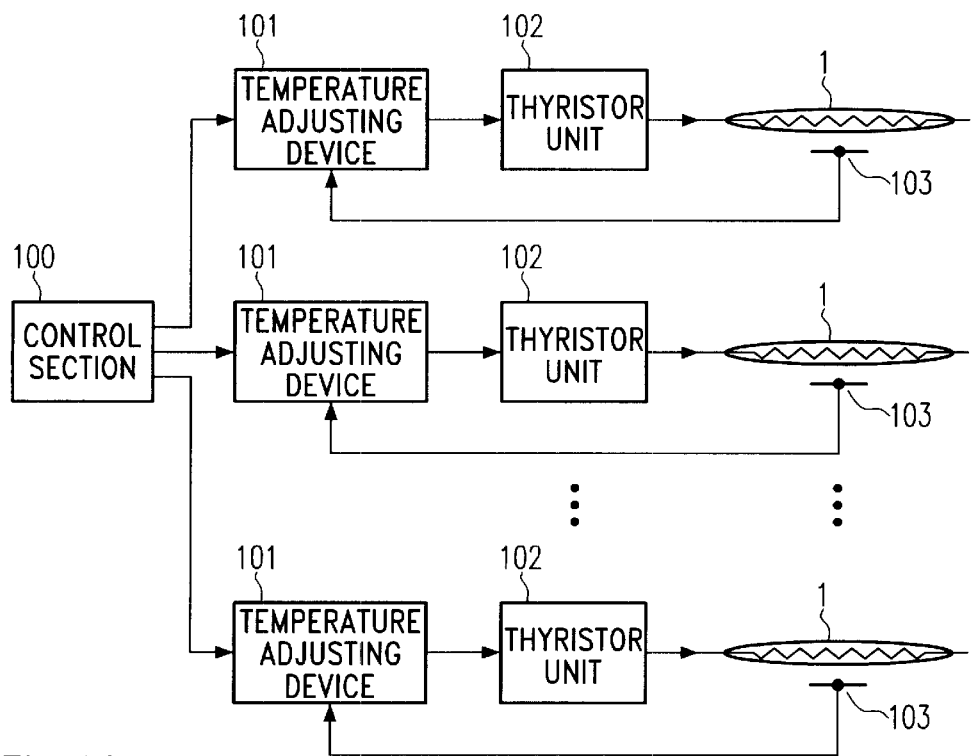
FIG. 19 is a view showing an example of a prior art configuration of a control device for performing control of a lamp.
Figure 20:
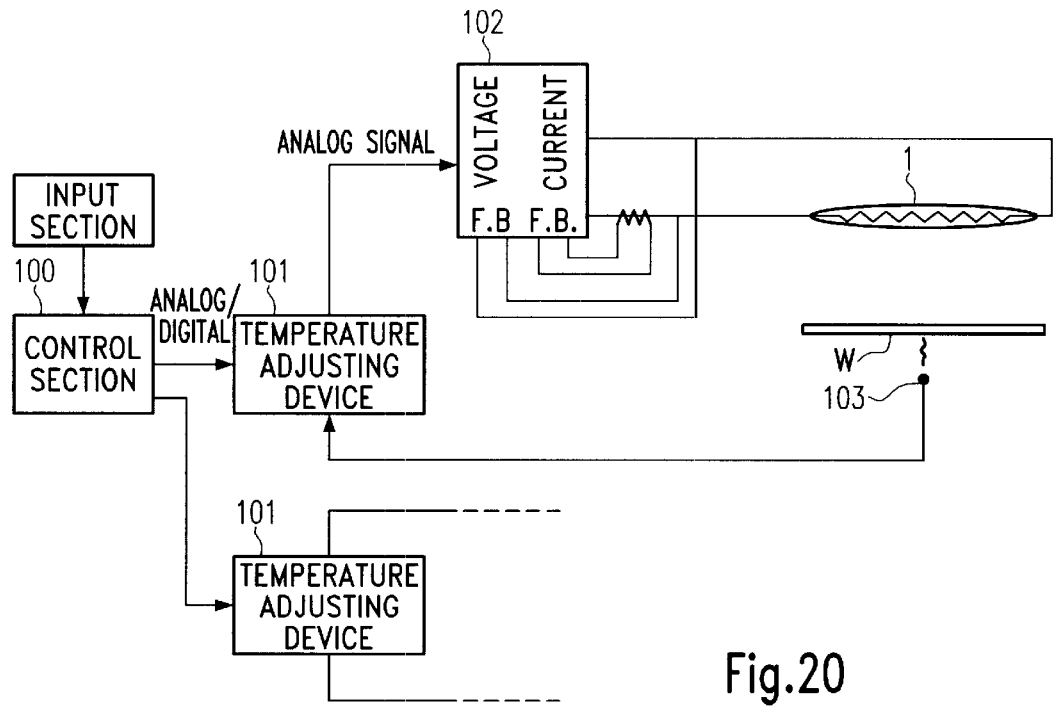
FIG. 20 is a view showing a detailed configuration of the lamp control device shown in FIG. 19.
Figure 21:
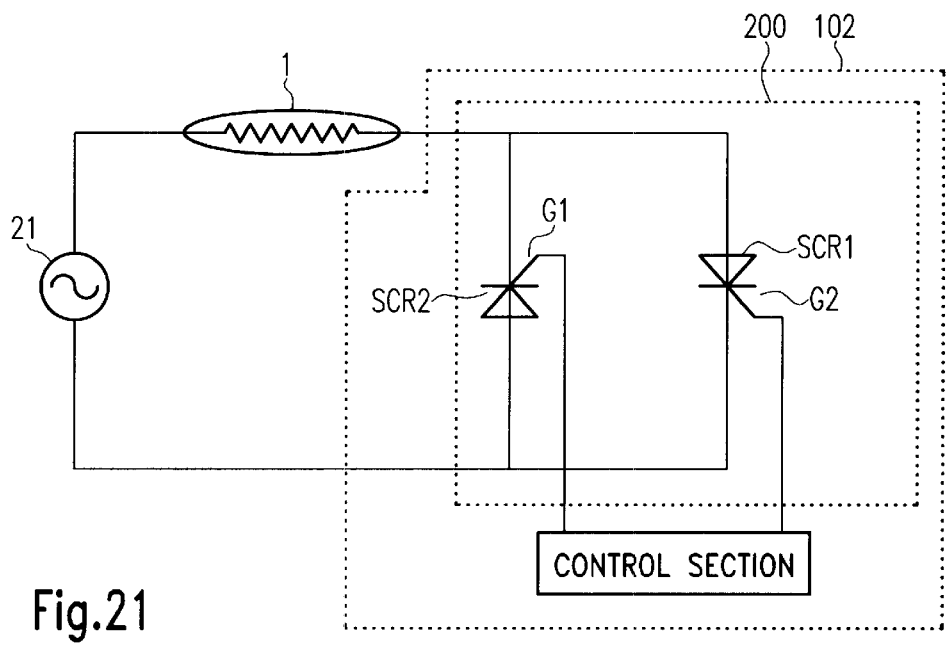
FIG. 21 is a view showing a configuration of a thyristor unit shown in FIGS. 19 and 20.
Figure 22A:
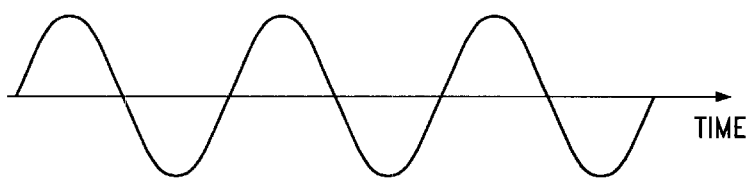
FIG. 22 is a view showing a waveform in each of the sections in the case that a conduction angle control of a thyristor is carried out.
Figure 22B:
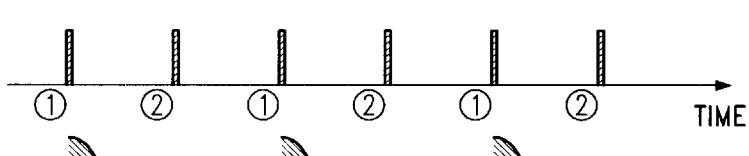
Figure 22C:
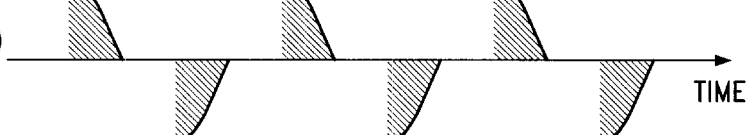
Figure 23A:
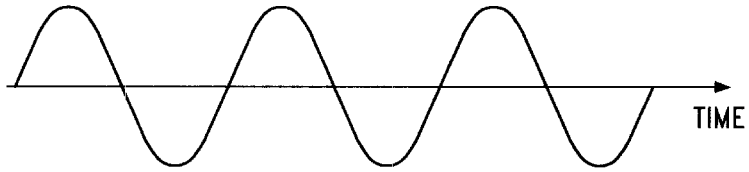
FIG. 23 is a view showing a waveform in each of the sections in the case that a zero-cross control for a thyristor is carried out.
Figure 23B:
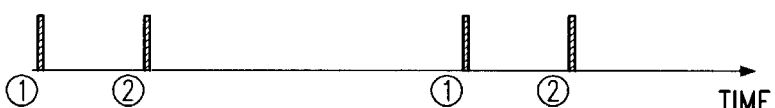
Figure 23C:
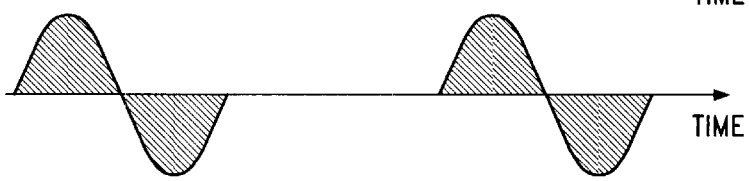

As shown in FIG. 2, the region wherein these lamps are arranged is divided into concentric zones 1 to 4. A power control unit 12 is provided for every zone so as to control the electrical power supplied to one or a plurality of lamps belonging to each of the zones. In addition, FIGS. 2 and 3 illustrate a case in which two semi-circular lamps 1, 1' are combined with each other to form an annular shape, although it is also possible to use an arrangement in which the annular lamps shown in FIG. 18 are arranged in a concentric manner.

FIG. 4 shows a case in which a linear lamp 1 and a lamp 1' bent at a right angle are combined with each other to give a rectangular arrangement in correspondence with a case in which the shape of the workpiece to be heated and processed is a square. Also in this case, the region where the lamps 1, 1' are arranged is divided into a plurality of zones 1 to 5 corresponding to a distance from the center of the region. One power control unit 12 is arranged for every zone to control the electrical power supplied to the at least one lamp belonging to each of the zones.

Figure 5A:
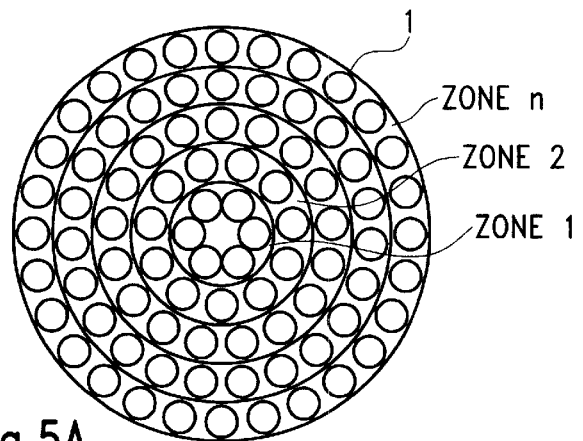
FIG. 5A is a view showing an example (3) of an arrangement of lamps.
Figure 5B:
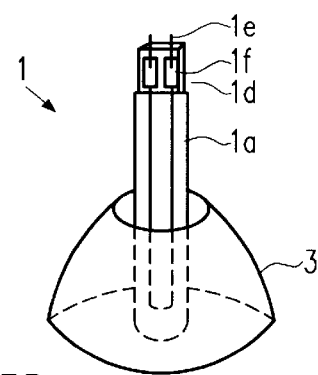
FIGS. 5B is a perspective view of lamp 1 in FIG. 5A.

FIG. 5A shows a case wherein use is made of lamps 1 as shown in FIG. 5B. Each lamp 1 has a single end with only one seal part. A cup-shaped mirror 3 is fixed to each of the lamps 1 shown in FIG. 5B. A plurality of lamps is arranged in a concentric manner as shown in FIG. 5A. Also in this case, the region having the lamps 1, 1' arranged therein is divided into a plurality of zones 1 to (n) corresponding to a distance from the center of the region indicated in FIG. 5A.

Figure 6:
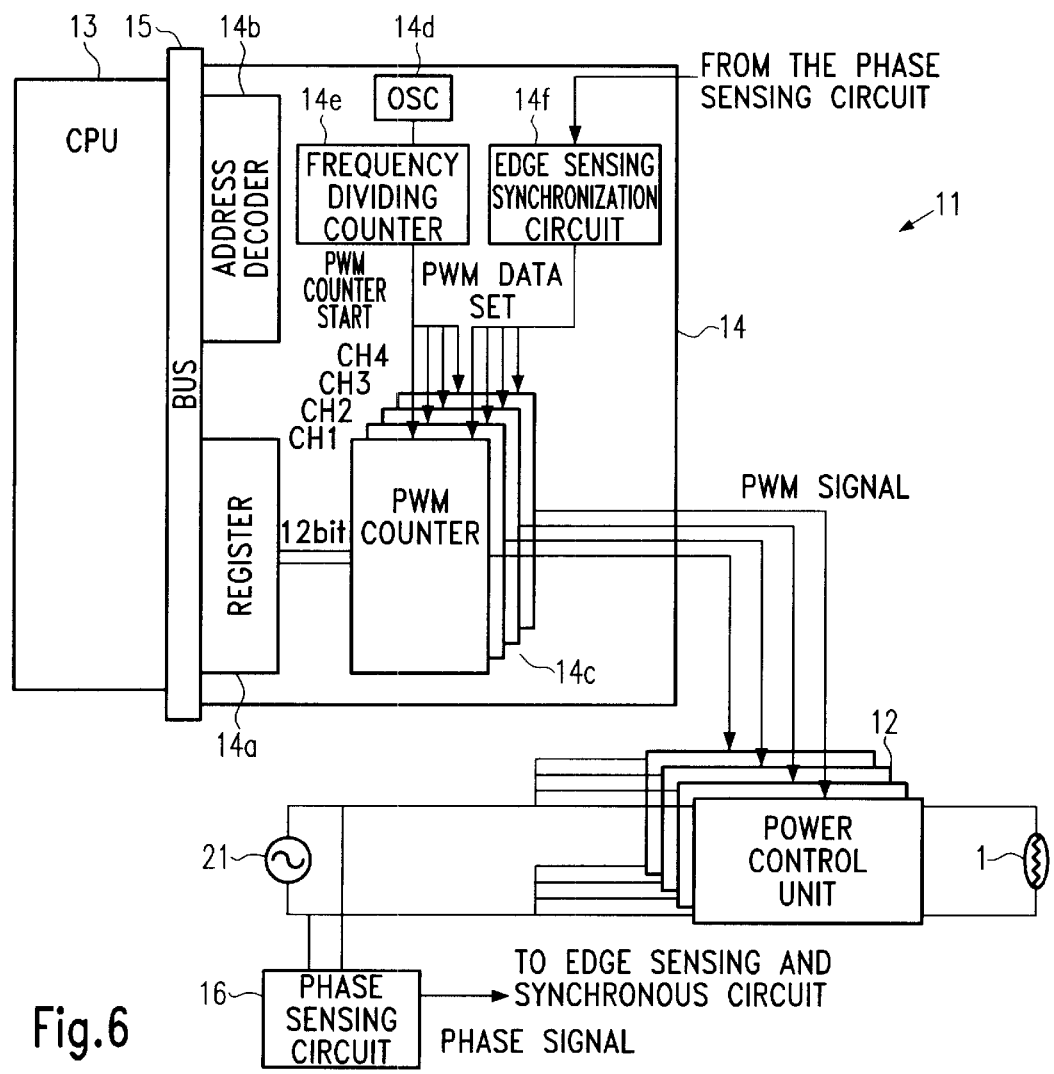
FIG. 6 is a view showing an example of a practical configuration of a control section.

FIG. 6 shows an example of a practical configuration of the control part 11 shown in FIG. 1. In this figure, a CPU 13 and a PWM control circuit constitute the control part 11. The CPU 13 and the PWM control circuit 14 are connected via a bus 15. The PWM control circuit 14 is provided with a PWM counter 14c having channels CH1 to CH4 corresponding to each of the power control units 12. Each of the power control units 12 controls the power of the lamps belonging to a respective one of the zones by the PWM signal outputted from each of the PWM counters 14c (in this example, a case in which four zones are present is shown).

In addition, there is provided a phase sensing circuit 16, wherein the voltage phase of the power supply 21 is detected by the phase sensing circuit 16.

Figure 7:
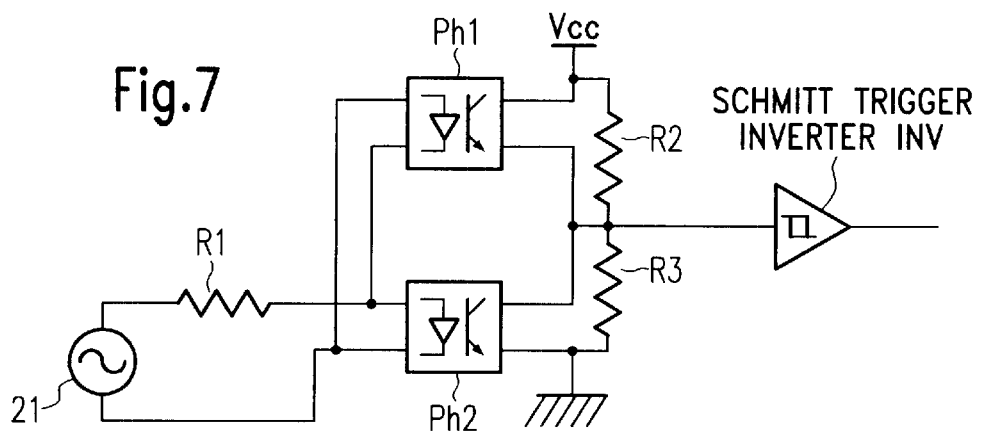
FIG. 7 is a view showing an example of a configuration of a phase sensing circuit.

FIG. 7 shows an example of a configuration of the phase sensing circuit 16. The phase sensing circuit 16 is constituted by photo-couplers Ph1, Ph2, resistors R1 to R3 and a Schmitt trigger inverter INV. When the voltage of the power supply 17 is positive, the photo-coupler Ph1 becomes conductive and, in turn, when the voltage becomes negative, the photo-coupler Ph2 becomes conductive. A high-level output and a low-level output are generated at the output of the Schmitt trigger inverter INV in response to the power supply phase. That is, the output of the phase sensing circuit 16 changes from high level to low level and from low level to high level at the zero cross point of the power supply voltage.

Returning now to FIG. 6, a time-based changing pattern of the power supplied to the lamps 1 belonging to the respective zones is stored in advance in the CPU 13 of the control part 11 (to be described later). When the heating and processing start to operate, the CPU 13 may output digital data corresponding to the power supplied to the lamps belonging to the respective zones together with an address signal.

The aforesaid address signal is decoded by an address decoder 14b, and the digital data outputted by the CPU 13 is set in the region corresponding to the address signal of the register 14a arranged in the PWM control circuit 14 in response to the result of the decoding operation.

In turn, the output of the phase sensing circuit 16 is inputted to an edge sensing synchronizing circuit 14. The edge sensing synchronizing circuit 14 may detect a raising edge and a falling edge (the zero-cross point of the power supply voltage) of the phase signal outputted by the phase sensing circuit 16. The edge sensing synchronizing circuit 14f then outputs a PWM data set signal at the zero cross point of the power supply voltage. When the PWM data set signal is outputted, the digital data set at each of the regions in the register 14a is transferred to each of the PWM counters 14c and preset. In addition, in order to transfer the digital data at a high speed, the register 14a and the PWM counter 14c are connected by a parallel transfer line of 12 bits, for example.

In addition, a clock pulse outputted by the oscillator 14d is divided in its frequency by a frequency divider 14e and given to the PWM counter 14c as a PWM counter start signal. When the PWM counter start signal is inputted to the PWM counter 14c, the PWM counter 14c starts to count a clock signal (not shown). When the counted value reaches the preset value, it is reset to zero. When the PWM counter start signal is inputted, the counting is started again and a similar operation will be repeated.

During a period in which the PWM counter 14c is performing a counting operation, the PWM counter 14c may generate a high level output. Due to this fact, a pulse signal having a time width corresponding to the preset value set by the PWM data set signal is repeatedly outputted from the PWM counter 14c at a period of the PWM counter start signal outputted by the frequency divider 14e. This signal is given to each of the power control units 12.

Figure 8:
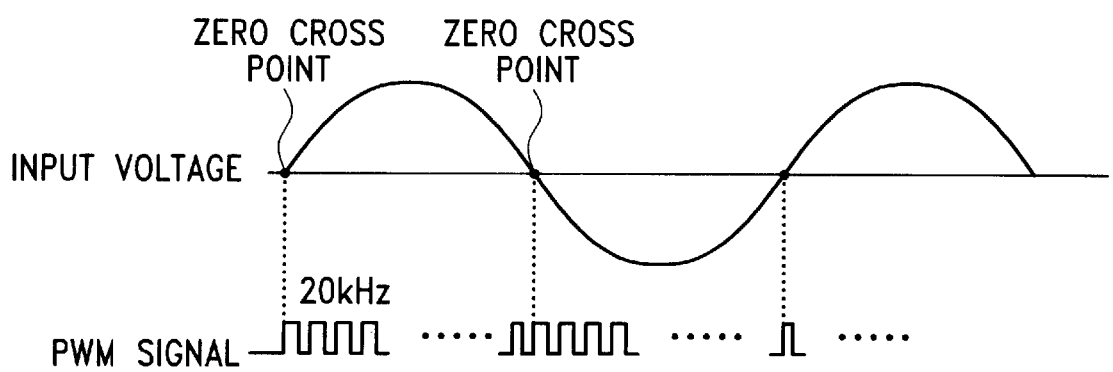
FIG. 8 is a view showing a PWM signal outputted from a PWM control circuit.

FIG. 8 shows an output signal of the PWM control circuit 14. The PWM control circuit 14 may output a pulse signal of duty corresponding to the digital data set in the register 14a at a repeated frequency of 20 kHz (a period of the PWM counter start signal), for example.

In this case, the PWM data set signal is outputted as described above at the zero cross point of the power supply voltage so that the duty of the PWM signal outputted by the PWM counter 14c during the semi-period of the power supply voltage is not changed. Due to this fact, the current provided to each of the power control units 12 is changed at each of the semi-periods to a substantial sinusoidal waveform. With such an arrangement as above, it is possible to reduce the higher harmonics strain and to prevent the power factor from being reduced.

Figure 9A:
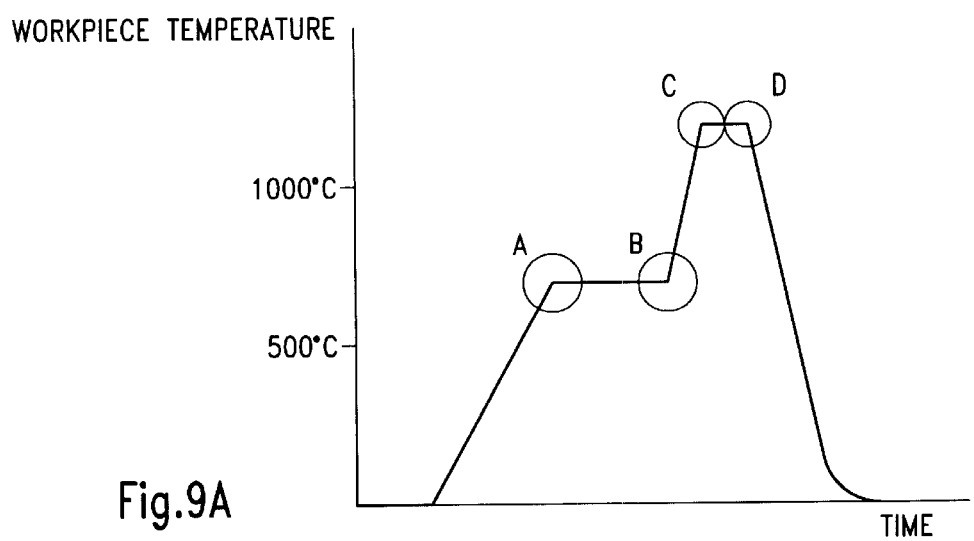
FIG. 9 is a view showing one example of a temperature increasing pattern and a duty signal.

FIG. 9 shows one example of a temperature increasing pattern when the workpiece W is rapidly heated and a duty signal given to the power control unit 12.

When the workpiece W is rapidly heated, as shown in (a) of FIG. 9, at first, the temperature of the workpiece W is increased to a point A in this figure. Thereafter the workpiece is kept at this temperature for a predetermined period of time. Due to this fact, the PWM control circuit 14 may output a PWM signal of relatively high duty up to the point A as shown in (b) of FIG. 9 and, when it reaches the point A, the duty of the PWM signal is reduced.

When point B in (a) of FIG. 9 is reached, the temperature of the workpiece W is increased. Due to this fact, the duty of the PWM signal outputted by the PWM control circuit 14 is increased as shown in (c) of FIG. 9.

The temperature of the workpiece W is increased again and reaches point C, and is kept at this temperature for a predetermined period of time. The duty of the PWM signal outputted by the PWM control circuit 14 becomes low at point C as shown in FIG. 9(d).

When the temperature of the workpiece W reaches point D after being kept for a predetermined period of time, the temperature of the workpiece W is reduced. The duty of the PWM signal outputted by the PWM control circuit 14 becomes zero at point D as shown in (e) of FIG. 9, and the lamp is turned off.

In FIG. 9, although a typical example of the PWM signal supplied to the power control units 12 is shown, the workpiece W radiates heat from its outer edge portion, and light from the lamps 1 interferes with one another. Accordingly, in view of these facts, it is necessary to distribute the power supplied to the lamps belonging to each of the zones.

That is, since the light is radiated from a plurality of lamps 1 onto the workpiece W, the light interferes with each other as shown in (a) of FIG. 10 (the hatched portion in this figure). Due to this fact, if the amount of light radiated from each of the lamps is set equal, the surface of the workpiece W cannot be necessarily kept at the specified temperature.

In addition, since the workpiece W radiates heat from its outer edge, the thermal radiation characteristic of the workpiece W is as indicated in FIG. 9(b). Accordingly, in order to keep the temperature of the workpiece W constant, it is correspondingly necessary to increase the power of the lamps near the peripheral part thereof. However, increasing the lamp power near the peripheral part will also cause the temperature of the surface of the center part of the workpiece to be increased so that it is necessary to slightly reduce the lamp power.

With such an arrangement as above, the power ratio of the electrical power supplied to the lamps 1 is set as shown in (c) of FIG. 10, for example, whereby the surface temperature of the workpiece W can be kept at a substantial constant temperature as shown in (d) of FIG. 10.

A time-based changing pattern of the power supplied to each of the lamps and a power distribution of the lamps in each of the zones or the like can be calculated experimentally or through theoretical equations and the like, and the amount of electrical power supplied to the lamps belonging to each of the zones corresponding to an amount of heating and processing of the workpiece W is defined in advance through experiment and theoretical equations and the like. Then, a corresponding control signal is stored in a memory part of CPU 13 (not shown). When the set electrical power is inputted, CPU 13 reads out the corresponding control signal and supplies it to the aforesaid PWM control circuit 14.

In a preferred embodiment, since the digital data stored in advance in CPU 13 as described above is sent to the PWM control circuit 14 through the bus 15, the PWM signal is generated in the PWM control circuit 14 and sent to each of the power control units, a delay in control caused by a delay in feed-back as found in the prior art does not occur, and further a delay due to conversion of digital data into an analogue signal and the like is not encountered. Due to this fact, a high-speed control can be attained.

Now, the aforesaid power control unit will be described.

Figure 11:
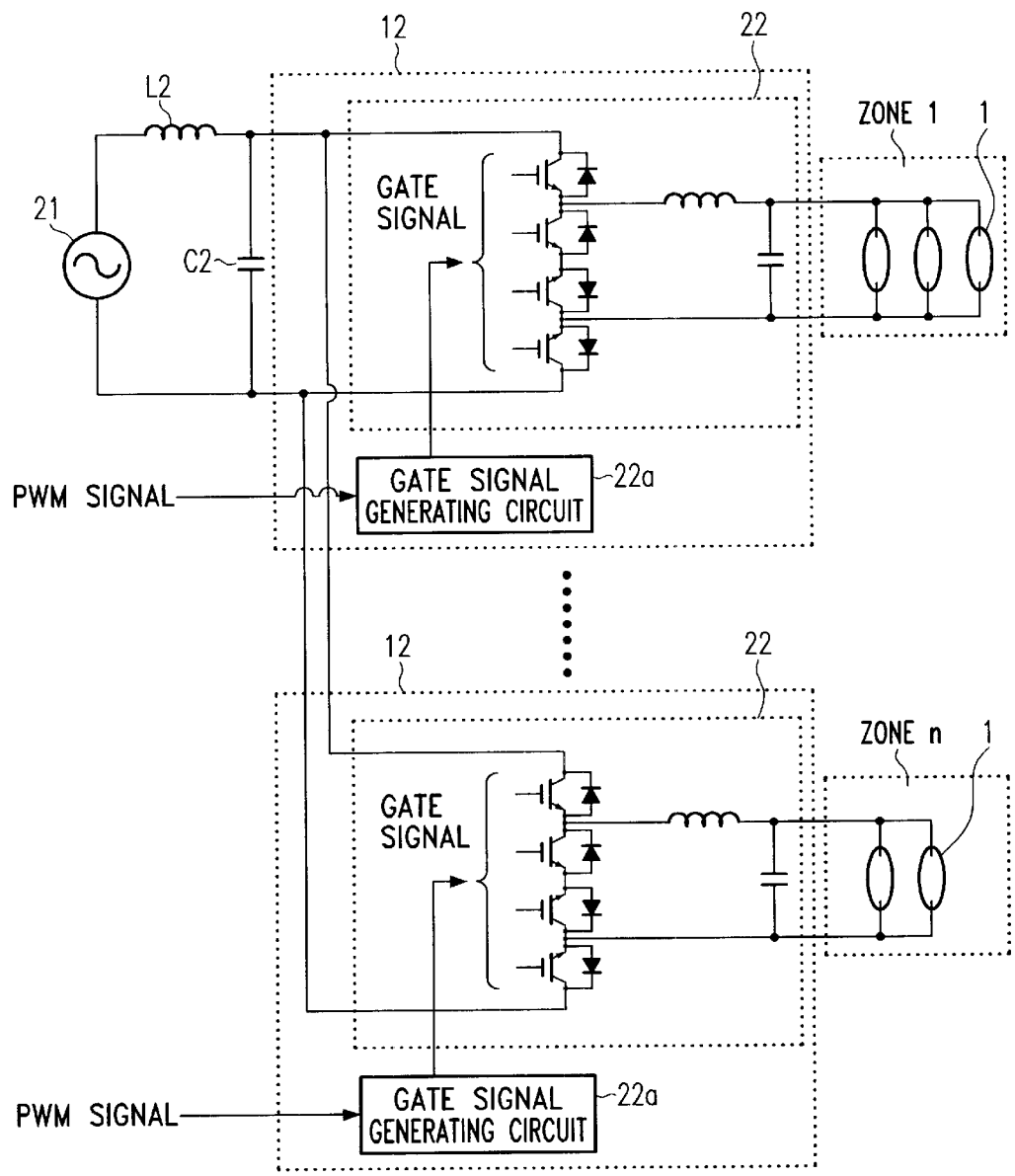
FIG. 11 is a view showing an example of a configuration of a lamp power control unit.

FIG. 11 shows an example of a configuration of the lamp power control unit 12 shown in FIGS. 1 and 6.

In this figure, the switching element of the lamp control circuit 22 is controlled by a gate signal supplied from the gate signal generating circuit 22a and controls an AC input supplied from the AC power supply 21 so as to supply an electrical power to the lamp 1.

The gate signal generating circuit 22a generates a switching signal in response to an output of the PWM control circuit 14 and turns ON/OFF the switching element of each of the control circuits 22.

Figure 12:
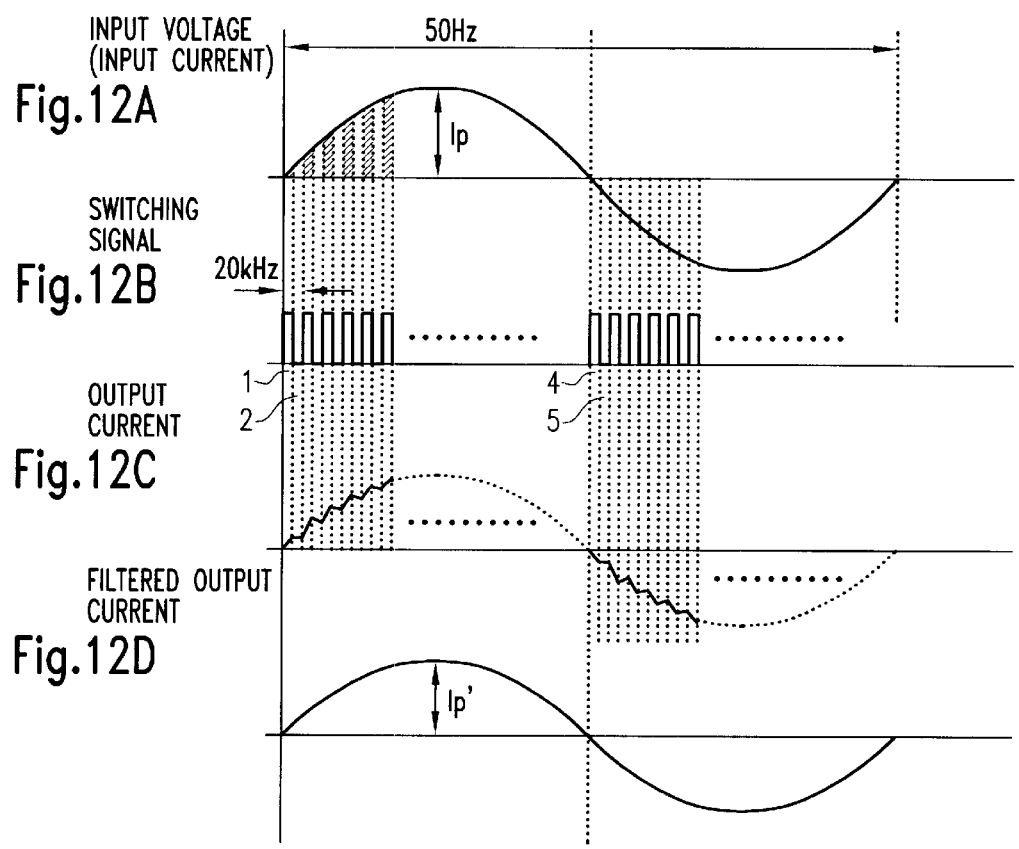
FIG. 12 is a view showing a waveform at each of the segments of a lamp power control unit shown in FIG. 11.

That is, the input voltage (current) shown in FIG. 12(a) is turned ON/OFF with the switching signal shown in (b) of FIG. 12 to attain an output current shown in (c) of FIG. 12. In addition, FIG. 12 shows a case in which the duty is approximately 50%. Further a current converting switching circuit is arranged in parallel with a load and an inductance is arranged in series with the lamp 1. When the switching circuit connected in series with the input side is turned off, the switching circuit for the current conversion process is turned on to cause an output current to continuously flow through the current conversion circuit.

Although even the waveform shown in FIG. 12(c) gives a waveform approximately corresponding to a sinusoidal wave if the frequency of the switching signal is increased, the output current shown in (c) of FIG. 12 is further filtered to give the sinusoidal wave output shown in FIG. 12(c). In addition, the input current may also be converted into a sinusoidal wave by passing it through a low-pass filter.

The operation of the control circuit shown in FIG. 11 will now be described.

Figure 13:
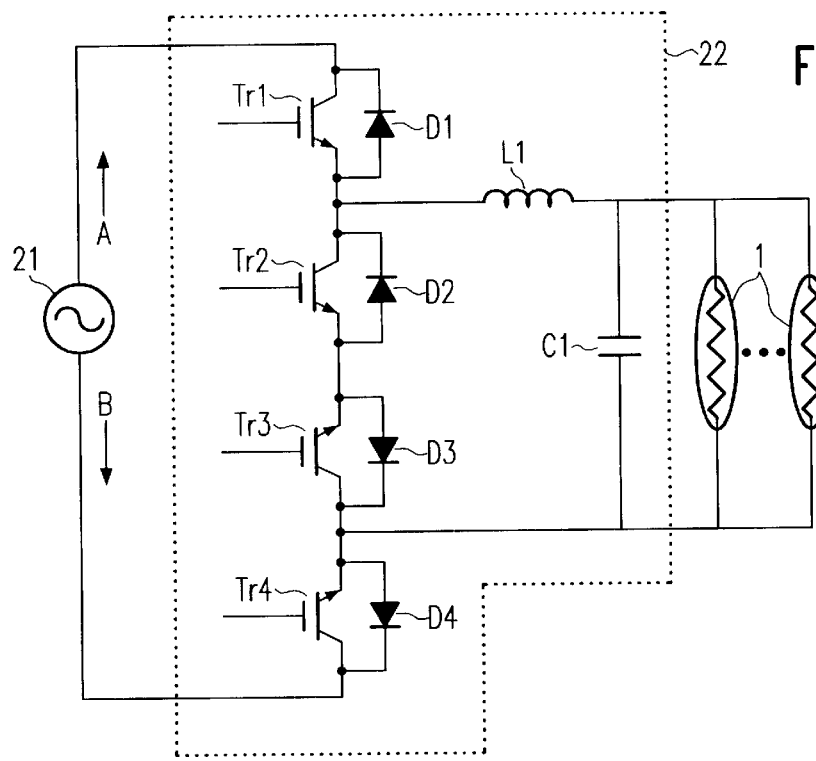
FIG. 13 is a view showing a configuration of a lamp control circuit in FIG. 11.

FIG. 13 shows a configuration of the control circuit of the preferred embodiment shown in FIG. 11. This figure illustrates one of the control circuits 22 shown in FIG. 11 in more detail. In this figure, reference numeral 22 denotes a control circuit; 21 an AC power supply; Tr1 to Tr4 switching elements; D1 to D4 diodes; C1 a capacitor; L1 an inductance; and 1 a lamp, respectively.

The switching elements Tr1 to Tr4 are turned ON/OFF at a predetermined driving frequency as shown in FIG. 12 with a gate signal generated by the gate signal generating circuit 22a shown in FIG. 11. This driving frequency is selected as a predetermined higher harmonics, for example, about 20 kHz. If this frequency is too low the capacitance of the capacitor C1 arranged at the output side is increased and noise is generated. In turn, if this driving frequency is too high the efficiency of the switching element will be deteriorated, so that it is desirable to appropriately set this value to a suitable value.

In FIG. 13, the control circuit 22 is operated as follows.

Figure 14:
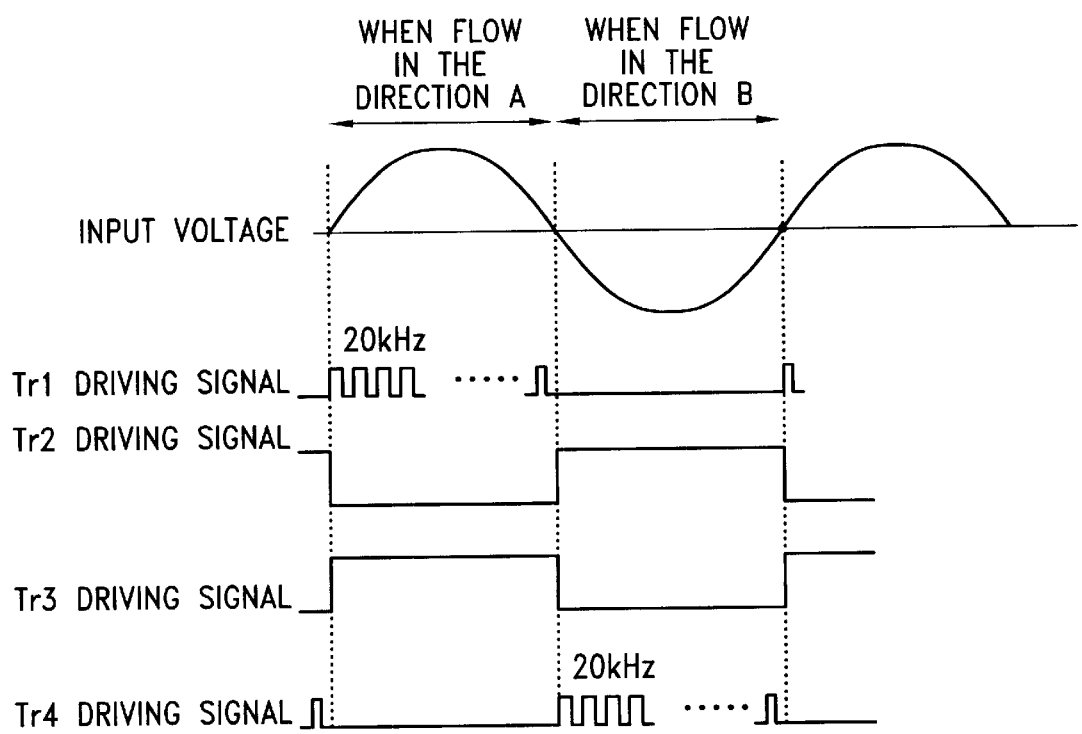
FIG. 14 is a view illustrating a gate signal for driving each of the switching elements.

A commercial AC power supply 21 supplies the power to the control circuit 22. In one case the input current flows in a direction A in FIG. 13, and in the other case it flows in a direction B. In both cases, each of the switching elements is controlled as shown in FIG. 14.

(1) Input Current Flows in a Direction A:

1 First and third switching elements Tr1, Tr3 are turned ON, and switching elements Tr2, Tr4 are turned OFF. Output current flows from the first switching element Tr1→→inductance L1→→lamp 4→→the fourth diode D4.

2 The first switching element Tr1 is turned OFF while the third switching element is being turned ON, and the remaining switching elements Tr2, Tr4 are kept OFF. Current which remained in the inductance L1 flows from the inductance L1→→lamp 4→→the third switching element Tr3→→the second diode D2→→the inductance L1.

3 The switching combining the above 1 and 2 is repeated.

4 The second and fourth switching elements Tr2, Tr4 are turned ON, and the switching elements Tr1, Tr3 are turned OFF. The output current flows from the fourth switching element Tr4→→lamp 4→→inductance L1→→the first diode D1.

5 The fourth switching element Tr4 is turned OFF while the second switching element Tr2 is kept ON, and the switching elements Tr1, Tr3 are kept OFF. Current which remained in the inductance L1 flows from the inductance L1→→the second switching element Tr2→→the third diode D3→→lamp 4→→inductance L1.

6 Switching combining the above 4 and 5 is repeated.

Controlling performed as described above causes the waveform at each of the sections in the control circuit 22 to become as indicated in FIG. 12 above. In this case, it is assumed that a commercial AC power supply of 50 kHz is used with the control circuit 22, and the switching frequency of the switching elements Tr1 to Tr4 is 20 kHz.

The waveform of the input voltage is as shown in FIG. 12(a). If the switching is carried out under a duty of about 50%, the switching signal is as shown in FIG. 12(b) above. In this case, 1 in this figure shows a case in which the circuit performs the operation of 1, and 2 in the above (1) indicates a case in which the circuit performs the above 2 in (1). The above 4 and 5 similarly indicate a case in which the circuit performs the above 4 and 5 in (2).

Performing the above switching operation causes the output current waveform of the control circuit 22 to become as shown in (c) of FIG. 12.

That is, in the case of 1 in (b) of FIG. 12, the current from the commercial AC power supply is outputted as it is, and the current value of the lamp is gradually increased. In addition, turning to 2 in (b) of FIG. 12, the output is separated from the commercial AC power supply, although the current flowing to the lamp 1 is gradually decreased due to the fact that the current remains in the inductance L1. If the circuit performs the above 1 again before the remaining current becomes 0, the output current is increased again. This state is similarly applied to the cases of 4 and 5.

In addition, in (c) of FIG. 12, although the corrugations are shown in an extreme exaggerated form for the sake of convenience in explanation, in practice, if a switching is carried out at 20 kHz, for example, the corrugations become quite low and the output waveform is a substantial sinusoidal wave without the necessity of arranging a filter circuit at the output side. If required, with the capacitor C1 being arranged at the output side, for example, a more neat sinusoidal waveform as shown in (d) of FIG. 12 can be attained.

In this case, when the duty is 1, only 1 is applied, the input waveform for the lamp will be the same as that inputted to the lamp control device and, in turn, when the duty is 0, only 2 is applied, and the input to the lamp is 0.

Accordingly, by changing the duty factors of switching between 0 and 1, it is possible to attain an output current having a sinusoidal waveform where the peak value is variable within a range of 0≦≦[a peak value Ip' of the output current]≦≦[a peak value Ip of the input current]. That is, it is possible to apply a current to the lamp 1 that can be varied continuously.

In turn, since the waveform of the input current for the control circuit 22 is repeated in its ON/OFF state with reference to the duty factors of the switching element, the input current has a waveform having a higher harmonics strain as shown in (a) of FIG. 12 (refer to the hatched part in this figure). In view of this fact, both the inductance L2 and the capacitor C2 are arranged at the input side of the control circuit 22 as shown in FIG. 11. With such an arrangement as described above it is possible to flatten the input current and to reduce the higher harmonics strain. As regards the inductance L2, there is no specific limitation to this element, but a wiring inductance can be utilized.

Further, as already proposed by the applicant (refer to Japanese Patent Application No. 10-2733424), if the switching elements of each of the control circuits 22 have a certain time difference, the higher harmonics strain of the input current can be reduced and the power factor is improved.

As described above, the input voltage (current) is chopped with the switching circuit, and the output voltage (current) is controlled, whereby the waveforms of output current, output voltage and input current can be converted to a substantially sinusoidal waveform, and the higher harmonics strain can be reduced. In addition, the power factor can be improved without generating a reactive power, a high rush current is not supplied to the lamp, the responding speed is rapid and control can be performed continuously.

That is, as described above, there is provided a phase sensing means to detect the power supply phase, generate the PWM signal which is synchronous with the power supply phase, and the switching element is operated synchronously with the power supply phase, resulting in that the input power factor can be improved without generating any reactive power, and the higher harmonics strain can be reduced. That is, the power control unit can drive the predetermined switching element in response to whether or not the AC sinusoidal current supplied from the AC power supply belongs to a half-period of the positive phase or a half-period of the negative phase.

Further, in the case that the duty of the PWM signal is changed, the duty factor of the PWM signal for driving the switching element of the control circuit is changed at the zero cross point of the AC power supply, so that the input current has a substantially sinusoidal waveform and the occurrence of the higher harmonics strain can be prevented.

Due to this fact, it is possible to restrict the occurrence of the reactive power and reduce the input current as well as to reduce the higher harmonic strain.

Figure 15:
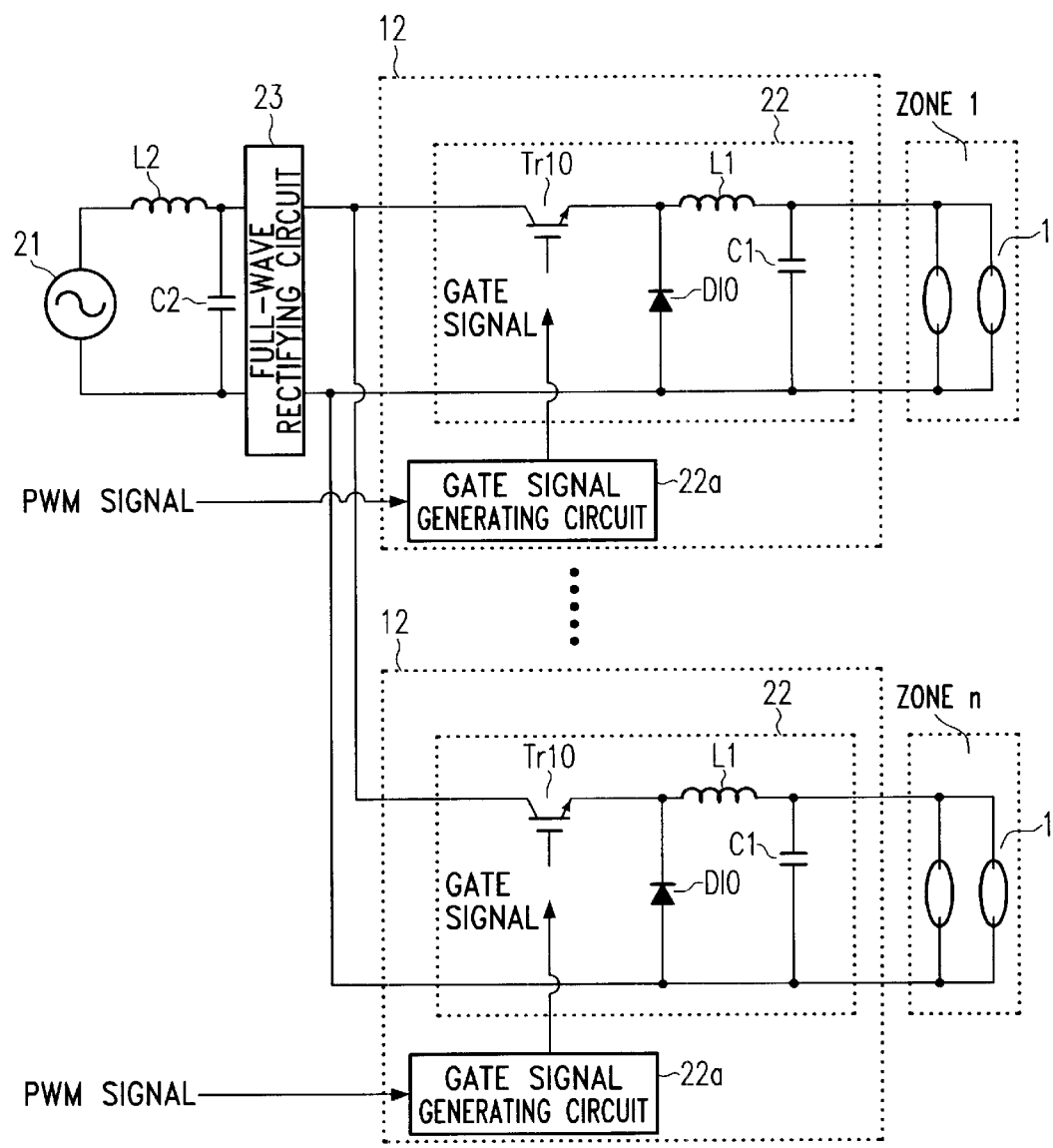
FIG. 15 is a view showing an example of another configuration of a lamp power control unit.

FIG. 15 shows an example of another configuration of the lamp power control unit.

In FIG. 15, reference numeral 22 denotes a lamp control circuit (hereinafter abbreviated as a control circuit); 21 an AC power supply; 23 a full-wave rectifier circuit; Tr10 a switching element; D10 a diode; L1 an inductance; C1 a capacitor; 1 a lamp; and 22a a gate signal generating circuit.

The switching element Tr10 shown is turned ON/OFF with a predetermined driving frequency by the gate signal generated by the gate signal generating circuit 22a. This driving frequency is selected to have a predetermined high frequency, about 20 kHz, in the same manner as that described with regard to FIG. 11.

In FIG. 15, the control circuit is operated as follows.

FIG. 16 shows a waveform for each of the sections in the control circuit 22 shown in FIG. 15 describing the operation of the control circuit of a preferred embodiment.

A commercial AC power supply 21 is used with the control circuit 22. The input voltage is full-wave rectified by the full-wave rectifier circuit 23, and a full-wave rectified voltage as shown in FIG. 16(a) is supplied to the switching element Tr10.

1 When an ON signal is supplied from the gate signal generating circuit 22a to the switching element Tr10 and the switching signal Tr10 is turned ON, the output current flows from the full-wave rectifier circuit 23→→switching element Tr10→→inductance L1→→lamp 1→→the full-wave rectifier circuit 23.

2 Then, as the first switching element Tr10 is turned OFF, current remaining in the inductance L1 flows in a direction from the inductance L1→→lamp 1→→the diode D10→→the inductance L1.

3 The switching under the combination of the above 1 and 2 is repeated.

Controlling performed as described above causes the waveform in each of the sections in the control circuit 22 to become as indicated in FIG. 16 above. In this case, it is assumed that a commercial AC power supply of 50 kHz is used with the control circuit, and the switching frequency of the switching elements Tr10 to Tr4 is 20 kHz.

The waveform of the input voltage is a waveform as shown in FIG. 16(a), and in the case that the switching is carried out under a duty of about 50%, the output current waveform of the control circuit is as shown in FIG. 16(b).

That is, when the switching element Tr10 is turned ON, the current from the commercial AC power supply is outputted as it is and the current value of the lamp 1 is gradually increased. In addition, when the switching element Tr10 is turned OFF, the output side is separated from the full-wave rectifier circuit 23, although the current is left in the inductance L1, resulting in that the current supplied to the lamp 1 is gradually decreased. If the switching element Tr10 is turned ON again before the remaining current becomes 0, the output current is increased again.

In addition, in (b) of FIG. 16, although the corrugations are shown in an extremely exaggerated form for the sake of convenience in explanation, in practice, if switching is carried out at 20 kHz, for example, the corrugations are quite small in the same manner as in the first preferred embodiment, and the output waveform becomes substantially sinusoidal without having to arrange a filter circuit at the output side. If required, it can be flattened with the capacitor C1 arranged at the output side, for example, and a more neat sinusoidal waveform can be obtained, as shown in FIG. 16(d).

Accordingly, by changing the switching duty of the switching element Tr10 between 0 and 1, it is possible to obtain an output current of a full-wave rectified waveform where the peak value described above is variable. That is, it is possible to apply a current to the lamp 1 that can be varied continuously.

In turn, since the waveform of the input current for the control circuit 22 is repeated in its ON/OFF state with reference to the duty of the switching element Tr10, the input current is as shown in FIG. 16(c) and the waveform has a higher harmonics strain.

In view of this fact, also in this case, both the inductance L2 and the capacitor C2 are arranged as described above at the input side of the control circuit 22 as shown in FIG. 15. With such an arrangement as above, it is possible to flatten the input current and to reduce the higher harmonics strain. Again, the inductance L2 is not restricted to a specific element, but a wiring inductance can be utilized.

Further, as described above, the switching element in each of the control circuits 22 is operated in sequence with a certain time lag and the higher harmonic strain at the input side can also be reducedit Applying the control circuit shown in FIG. 15 gives the similar effects as those discussed in connection with FIG. 1. In addition, the control device can be constituted by one switching element thus simplifying the circuit configuration. Further, the output current for the lamp is decreased down to a value approximate to 0 for every half-cycle of the AC input, so that in the same manner as that of the AC lit state, even if the filament is cut in the lamp, an arc does not build up between the cut filaments in the case that the lamp is lit by direct current.

When the duty of the PWM signal is changed, the duty factor of the PWM signal for driving the switching element of the power control unit is changed at the zero cross point of the AC power supply, so that the input current waveform of the power control unit 12 becomes an approximately full-wave rectified waveform, the input current of the AC power supply has an approximately AC sinusoidal waveform to enable the higher harmonics strain to be prevented. In addition, it is also possible to restrict the occurrence of reactive power and to improve the input power factor.

Further, in a preferred embodiment of the present invention, since the switching element of the power control unit performs an ON/OFF driving against the full-wave rectified current always having the same phase, it is not necessary to detect whether or not the AC sinusoidal current from the AC power supply has a positive phase.

In the foregoing description, although a case has been described wherein the temperature sensing element for sensing the temperature of the workpiece W is not installed, but the power supplied to the lamp is controlled in response to only the control signal stored in advance in the CPU 13 (the time-based changing pattern of the PWM signal), it may also be applicable to provide a temperature sensing element for sensing the temperature of the workpiece W, to input the temperature of the workpiece W detected by the temperature sensing element into the CPU 13 and to input whether or not the temperature of the workpiece W is increased up to the predetermined temperature.

I claim:

1. A control apparatus for a light radiation-type rapid heating and processing device comprising a region in which a plurality of filament lamps are arranged which emit light including infrared rays onto a processed substrate to perform a rapid heating of the processed substrate, wherein the region having said plurality of filament lamps arranged therein is divided into a plurality of zones corresponding to a distance from the center of said region, and at least one filament lamp is installed in each of the zones; said control apparatus being comprised of:

a plurality of lamp control units having switching elements for switching a sinusoidal alternating current supplied from an AC power supply or a full-wave rectified sinusoidal alternating current, each of the switching elements being arranged in correspondence with a respective one of the zones; and a control part for changing the duty factors of ON/OFF signals of each of the switching elements of said plurality of lamp power control units and for controlling the electrical power supplied to each of the filament lamps belonging to each of said zones.

2. A control apparatus for a light radiation-type rapid heating and processing device according to claim 1, wherein time-based changing patterns for the duty factors of the ON/OFF signals sent to the switching elements belonging to the zones are stored in advance in said control part in consideration of a thermal radiation characteristic of the processed substrate and a mutual interference of the filament lamps belonging to each of the zones, and wherein the control part comprises means for reading out the time-based changing pattern of said duty factors and for controlling the electrical power supplied to each of the filament lamps belonging to each of said zones.

3. A control apparatus for a light radiation-type rapid heating and processing device according to claim 1, wherein a phase sensing means is provided for sensing a phase of said alternating current and wherein said control part is adapted so as to change the duty factors of the ON/OFF signals of the switching elements belonging to a respective one of the zones at a zero cross point of the alternating current detected by said phase sensing means.

4. A control apparatus for a light radiation-type rapid heating and processing device according to claim 1, wherein a phase sensing means is provided for sensing a phase of said alternating current and said lamp control unit is adapted so as to perform a switching operation on the sinusoidal alternating current supplied from the AC power supply synchronously with a phase signal of the alternating current detected by said phase sensing means.

5. A control apparatus for a light radiation-type rapid heating and processing device according to claim 2, wherein a phase sensing means is provided for sensing a phase of said alternating current and wherein said control part is adapted so as to change the duty factors of the ON/OFF signals of the switching elements belonging to a respective one of the zones at a zero cross point of the alternating current detected by said phase sensing means.

6. A control apparatus for a light radiation-type rapid heating and processing device according to claim 2, wherein a phase sensing means is provided for sensing a phase of said alternating current and said lamp control unit is adapted so as to perform a switching operation on the sinusoidal alternating current supplied from the AC power supply synchronously with a phase signal of the alternating current detected by said phase sensing means.

7. The control apparatus of claim 1, wherein said plurality of lamp control units are free of thyristors.

8. The control apparatus of claim 1, wherein said switching elements for switching sinusoidal alternating current supplied from an AC power supply or a full-wave rectified sinusoidal alternating current are choppers for the AC power supply.

* * * * *